US006387769B2

(12) United States Patent
Dekker et al.

(10) Patent No.: US 6,387,769 B2
(45) Date of Patent: May 14, 2002

(54) METHOD OF PRODUCING A SCHOTTKY VARICAP

(75) Inventors: Ronald Dekker; Henricus Godefridus Rafael Maas; Anco Heringa, all of Eindhoven (NL); Holger Schligtenhorst, Boeblingen (DE)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/797,086

(22) Filed: Mar. 1, 2001

(30) Foreign Application Priority Data

Mar. 3, 2000 (EP) ............................................. 00200770

(51) Int. Cl.[7] .............................................. H01L 21/20
(52) U.S. Cl. ........................ 438/379; 438/508; 438/530
(58) Field of Search ................................. 438/379, 505, 438/506, 508, 527, 530, 923

(56) References Cited

U.S. PATENT DOCUMENTS

| 4,226,648 | A | * | 10/1980 | Goodwin et al. | ............ | 438/508 |
| 5,109,256 | A | | 4/1992 | De Long | .................... | 357/15 |
| 5,583,348 | A | | 12/1996 | Sundaram | .................... | 257/73 |
| 5,854,117 | A | * | 12/1998 | Huisman et al. | ............ | 438/379 |
| 6,228,734 | B1 | * | 5/2001 | Bliss et al. | .................. | 438/379 |

FOREIGN PATENT DOCUMENTS

JP         09275217 A       10/1997

* cited by examiner

Primary Examiner—Chandra Chaudhari
(74) Attorney, Agent, or Firm—Aaron Waxler

(57) ABSTRACT

A method of producing a Schottky varicap (25) including:
- (a) providing an epitaxial layer (12) on a semiconductor substrate (1);
- (b) providing an insulating layer including an oxide layer and a nitride layer on a predetermined area of the surface of the epitaxial layer (12);
- (c) depositing a polysilicon layer (6);
- (d) applying a first high temperature step to diffuse a guard ring (10) around the first predetermined area;
- (e) removing a predetermined portion of the polysilicon layer (6) to expose the first silicon nitride film (5);
- (f) implanting atoms through at least the first oxide film (4) to provide a predetermined varicap doping profile;
- (g) applying a second high temperature step to anneal and activate the varicap doping profile;
- (h) removing the first oxide film (4) to provide an exposed area;
- (i) providing a Schottky electrode (17) on the exposed area.

14 Claims, 6 Drawing Sheets

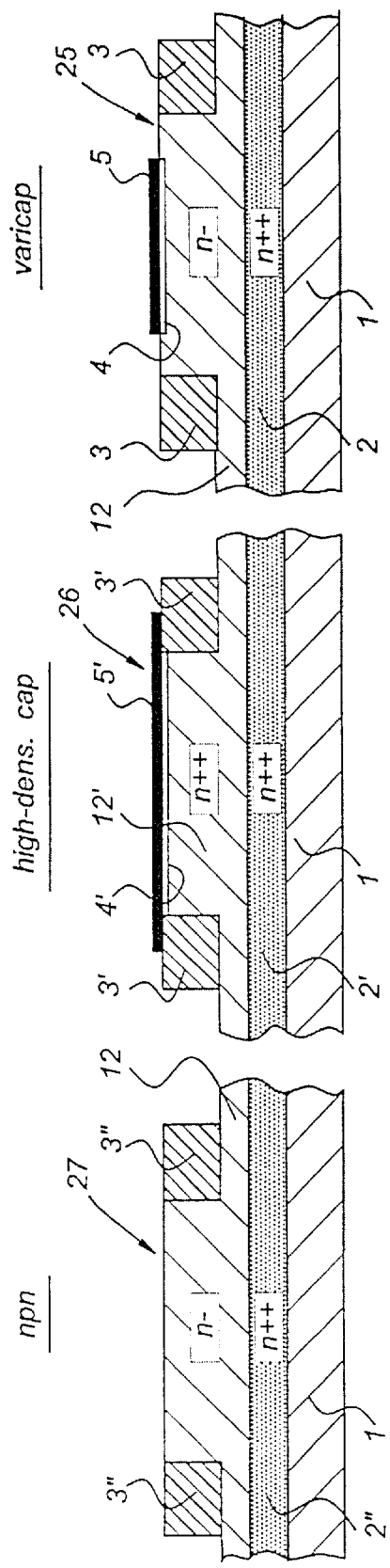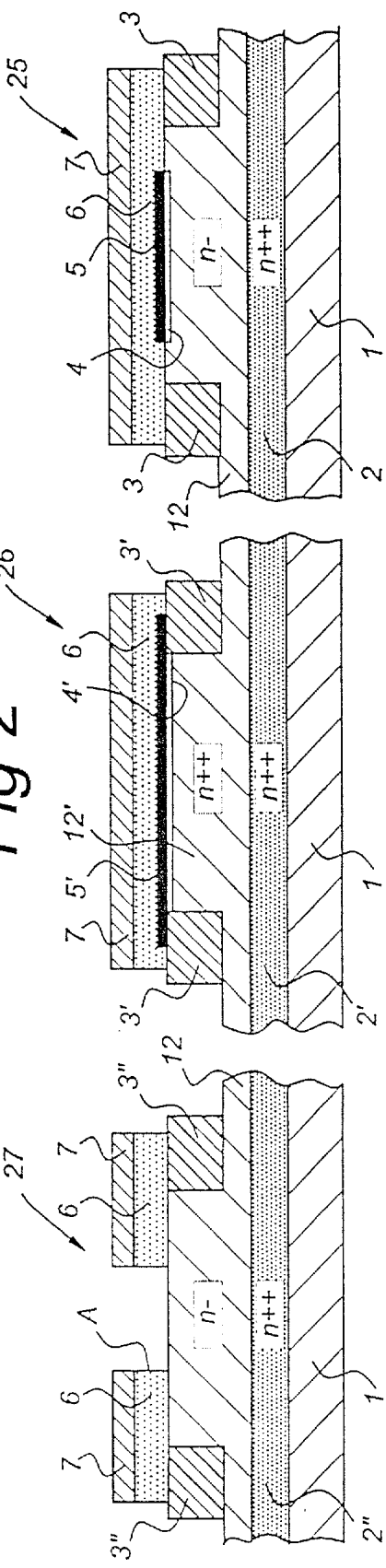

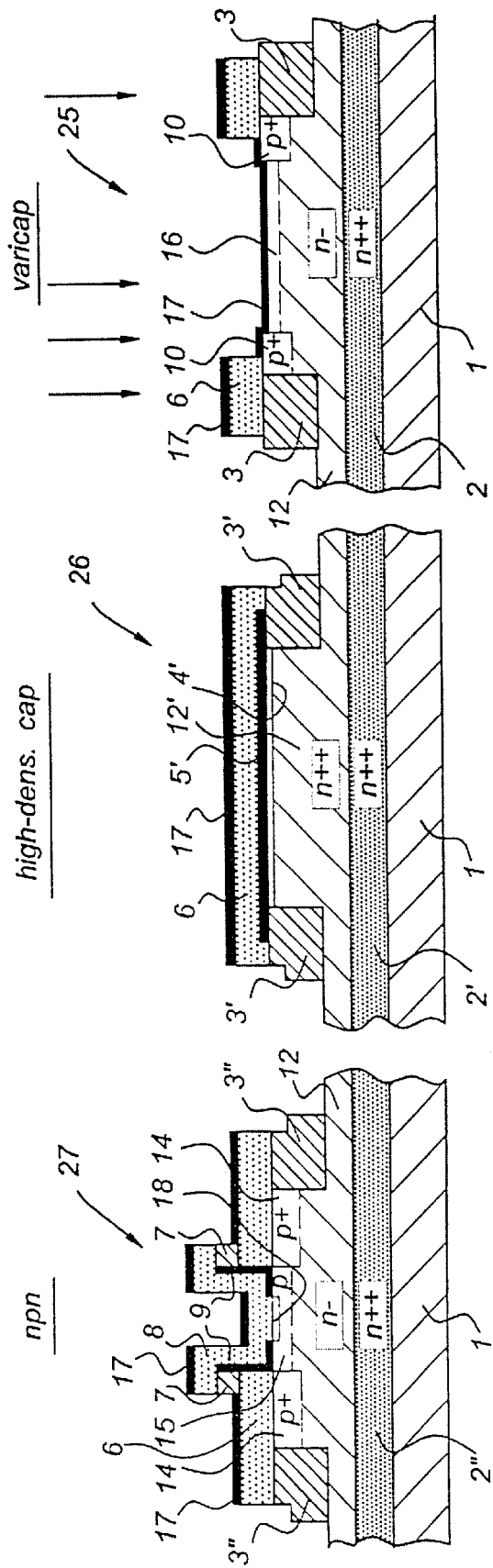

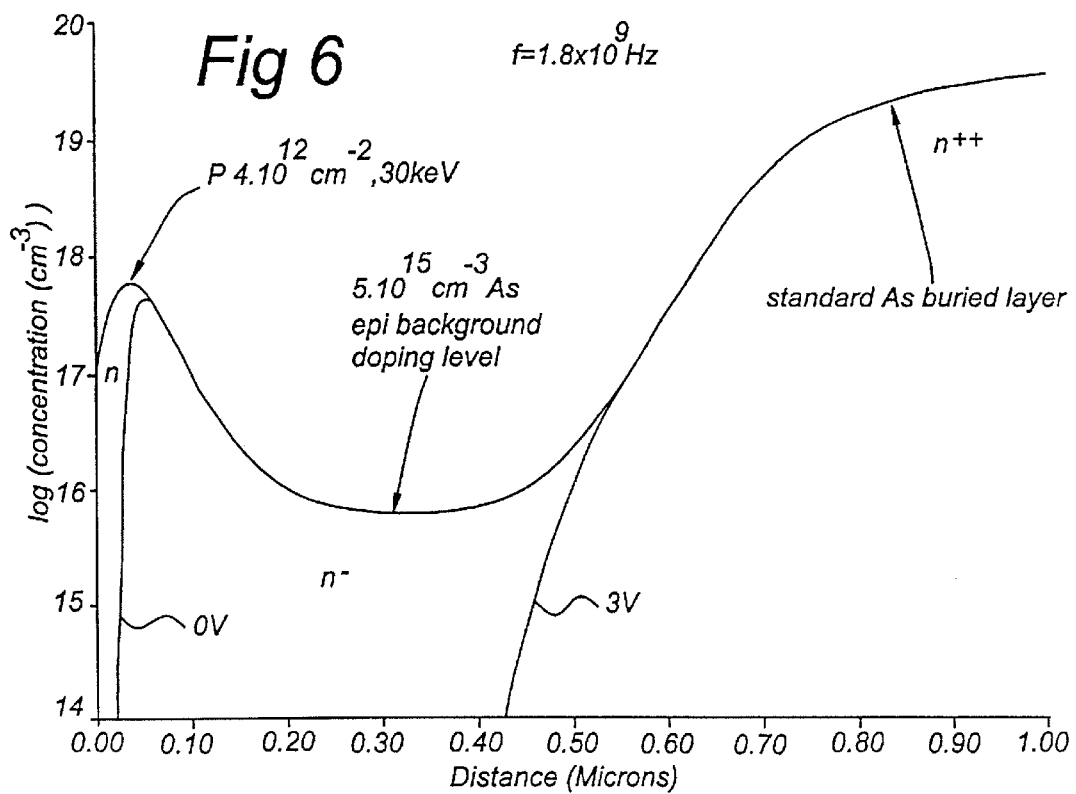
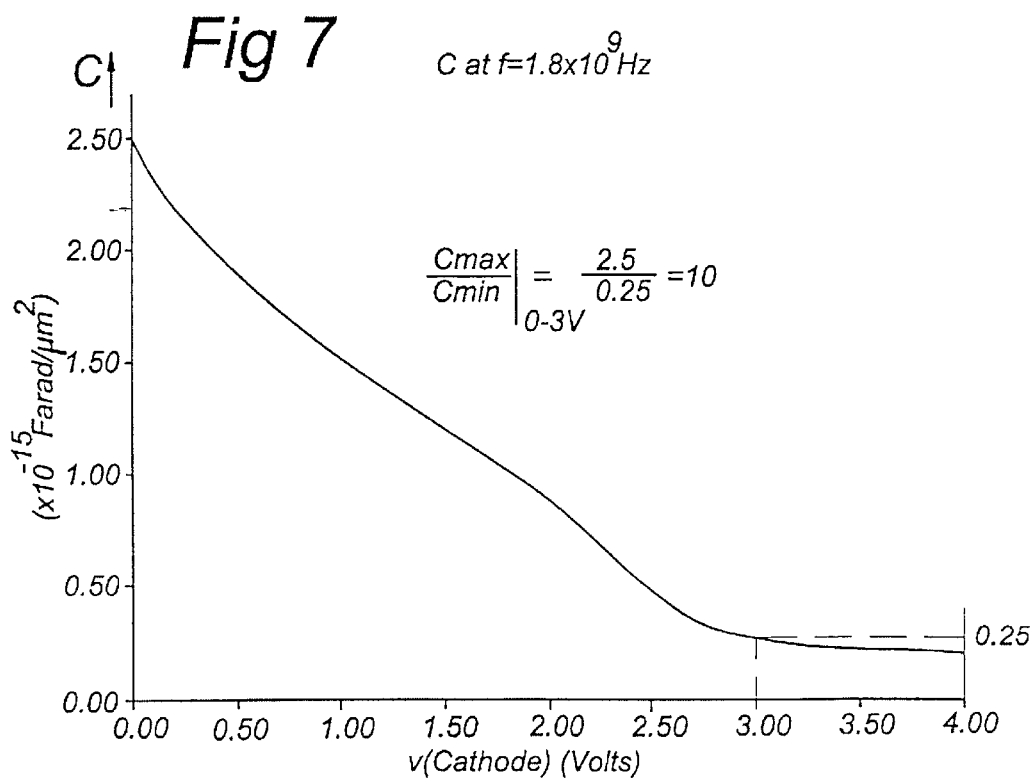

METHOD OF PRODUCING A SCHOTTKY VARICAP

FIELD OF THE INVENTION

The present invention relates to a method of producing a Schottky varicap using the following steps:

(a) providing an epitaxial layer on a semiconductor substrate, the epitaxial layer having an upper surface and being of a first conductivity type;

(b) implanting atoms to provide the epitaxial layer with a predetermined varicap doping profile;

(c) providing a Schottky electrode on the epitaxial layer.

BACKGROUND OF THE INVENTION

Such a method is known from JP-A-09/275217. In the known method, impurity atoms are implanted in the epitaxial layer to generate a Gaussian distribution. The surface of the epitaxial layer is etched until the peak concentration of the Gaussian distribution is reached. Then, the Schottky electrode is deposited on the epitaxial layer. An ohmic electrode is deposited on the opposing side of the substrate. This method renders Schottky varicaps but is not well suited to be used in an integrated process in which also other components are formed at the same time. Moreover, since the epitaxial layer is etched itself damage may easily occur and it is difficult to obtain a pure surface on which the Schottky electrode is deposited.

In several applications, one desires to employ a high quality varicap for integration in a RF-process. Requirements regarding the varicaps may be e.g.:

1. by adding a varicap to the process, only a minimum additional complexity is accepted, preferably, no more than 1 additional mask;
2. full freedom to apply required doping profiles in the varicap since they determine both the tuning range and the quality factor of the varicap for a given frequency;
3. after the varicap doping profile has been made, no long-lasting high temperature step is allowed in order to avoid further diffusion into the epitaxial layer;
4. full freedom to apply doping profiles in other components;
5. low reverse bias leakage current in the varicap.

It is observed that it is known as such to produce Schottky barrier diodes simultaneously with bipolar transistors on a single substrate, cf. e.g. U.S. Pat. No. 5,109,256 and U.S. Pat. No. 5,583,348. The application of guard rings is also known from these documents.

SUMMARY OF THE INVENTION

The object of the invention is to provide a method of producing a varicap that can be integrated on a single chip with other semiconductor components like bipolar transistors and high density capacitors. Basically, the inventor of the invention has found that the requirements listed above can be met by a Schottky varicap. Therefore, the invention provides a method of producing a Schottky varicap using the following steps:

(a) providing an epitaxial layer on a semiconductor substrate, the epitaxial layer having an upper surface and being of a first conductivity type;

(b) providing an insulating layer, and patterning the insulating layer to provide an insulating film on a predetermined area of the surface of the epitaxial layer, the insulating film comprising an oxide film contacting the epitaxial film on the predetermined area and a silicon nitride film above the oxide film;

(c) depositing a polysilicon layer of a second conductivity type;

(d) applying a first high temperature step to diffuse a guard ring of the second conductivity type into the epitaxial layer around the first predetermined area;

(e) removing a predetermined portion of the polysilicon layer to expose the first silicon nitride film;

(f) implanting atoms through at least the first oxide film to provide the epitaxial layer with a predetermined varicap doping profile;

(g) applying a second high temperature step to anneal and activate the varicap doping profile;

(h) removing the first oxide film to provide an exposed area of the upper surface of the epitaxial layer with the predetermined varicap doping profile;

(i) providing a Schottky electrode on the exposed area.

With such a method a Schottky varicap can be produced that shows a very low reverse bias leakage current due to the guard ring and due to the application of the insulating layer comprising an oxide layer and a nitride layer during the manufacturing process. The latter layers remain on the epitaxial surface until a very late process stage and protect the epitaxial layer from other process steps like plasma etching necessary for producing other components on the epitaxial layer like transistors and high density capacitors. Thus, the Schottky electrode will be deposited on a very pure portion of the epitaxial layer which greatly enhances the varicap performance. Moreover, the doping profile of the varicap can be controlled to a large extent. Consequently, the tuning range and quality factor of the Schottky varicap can be controlled optimally.

If desired, the Schottky varicap can be connected such that it operates as a forward biased diode.

The method of the invention can advantageously be used to produce simultaneously a Schottky varicap and a transistor on a single chip. Therefore, the invention also relates to a method of producing a Schottky varicap simultaneously with a transistor on a single chip using the following steps:

(a) providing an epitaxial layer on a semiconductor substrate, the epitaxial layer having an upper surface and being of a first conductivity type;

(b) providing an insulating film on a first predetermined area of the surface of the epitaxial layer, the insulating film comprising a first oxide film contacting the epitaxial layer and a first silicon nitride film above the first oxide film;

(c) depositing a polysilicon layer of a second conductivity type;

(d) providing an opening in the polysilicon layer at a second predetermined area of the surface of the epitaxial layer;

(e) providing a base diffusion region of a second conductivity type in the epitaxial layer below the opening;

(f) applying a first high temperature step to diffuse a guard ring of the second conductivity type into the epitaxial layer around the first predetermined area and to diffuse a base contact region adjacent to the second predetermined area;

(g) providing an emitter contact in the opening, which emitter contact is electrically insulated from the polysilicon layer;

(h) removing a predetermined portion of the polysilicon layer to expose the first silicon nitride film;

(i) implanting atoms through at least the first oxide film to provide the epitaxial layer with a predetermined varicap doping profile;

(j) applying a second high temperature step to diffuse an emitter region into the epitaxial layer, and to anneal and activate the varicap doping profile;

(k) removing the first oxide film to provide an exposed area of the upper surface of the epitaxial layer with the predetermined varicap doping profile;

(l) providing a Schottky electrode on the exposed area.

However, the invention can also be used to produce a Schottky varicap simultaneously with a high density capacitor, which method uses the following steps:

(a) providing an epitaxial layer on a semiconductor substrate, the epitaxial layer having an upper surface and being of a first conductivity type;

(b) implanting atoms in a second predetermined area of said upper surface to provide said epitaxial layer in said second predetermined area with a high doping concentration;

(c) providing an insulating layer, and patterning the insulating layer to provide a first insulating film on a first predetermined area of the surface of the epitaxial layer and a second insulating film on a second predetermined area of the surface of the epitaxial layer, the first insulating film comprising a first oxide film contacting the epitaxial film on the first predetermined area and a first silicon nitride film above the first oxide film, the second insulating film comprising a second oxide film contacting the epitaxial film on the second predetermined area and a second silicon nitride film above the second oxide film;

(d) depositing a polysilicon layer of a second conductivity type;

(e) applying a first high temperature step to diffuse a guard ring of the second conductivity type into the epitaxial layer around the first predetermined area;

(f) removing a predetermined portion of the polysilicon layer to expose the first silicon nitride film;

(g) implanting atoms through at least the first oxide film to provide the epitaxial layer with a predetermined varicap doping profile;

(h) applying a second high temperature step to anneal and activate the varicap doping profile;

(i) removing the first oxide film to provide an exposed area of the upper surface of the epitaxial layer with the predetermined varicap doping profile;

(j) providing a Schottky electrode on the exposed area.

In a very advantageous embodiment, the present invention provides a method in which a Schottky varicap, a high density capacitor and a transistor are simultaneously formed. The steps included in this method are:

(a) providing an epitaxial layer on a semiconductor substrate, the epitaxial layer having an upper surface and being of a first conductivity type;

(b) implanting atoms in a second predetermined area of said upper surface to provide said epitaxial layer in said second predetermined area with a high doping concentration;

(c) providing an insulating layer, and patterning the insulating layer to provide a first insulating film on a first predetermined area of the surface of the epitaxial layer and a second insulating film on a second predetermined area of the surface of the epitaxial layer, the first insulating film comprising a first oxide film contacting the epitaxial film on the first predetermined area and a first silicon nitride film above the first oxide film, the second insulating film comprising a second oxide film contacting the epitaxial film on the second predetermined area and a second silicon nitride film above the second oxide film;

(d) depositing a polysilicon layer of a second conductivity type;

(e) providing an opening in the polysilicon layer at a third predetermined area of the surface of the epitaxial layer;

(f) applying a first high temperature step to diffuse a guard ring of the second conductivity type into the epitaxial layer around the first predetermined area and to diffuse a base contact region adjacent to the third predetermined area;

(g) providing a base diffusion region of a second conductivity type in the epitaxial layer below the opening;

(h) providing an emitter contact in the opening, which emitter contact is electrically insulated from the polysilicon layer;

(i) removing a predetermined portion of the polysilicon layer to expose the first silicon nitride film;

(j) implanting atoms through at least the first oxide film to provide the epitaxial layer with a predetermined varicap doping profile;

(k) applying a second high temperature step to diffuse an emitter region into the epitaxial layer, and to anneal and activate the varicap doping profile;

(l) removing the first oxide film to provide an exposed area of the upper surface of the epitaxial layer with the predetermined varicap doping profile;

(m) providing a Schottky electrode on the exposed area.

A method of providing transistors and high density capacitors on a single chip is known per se. Compared with this known method only one additional mask is needed, i.e., the mask used in the step of removing the predetermined portion of the polysilicon layer to expose the first nitride film in the varicap area.

In an embodiment of these inventive methods, the predetermined varicap doping profile is obtained by implanting $4 \times 10^{12}$ cm$^{-2}$, 30 keV phosphor atoms in the step of implanting atoms through the first oxide film, and the epitaxial layer has a $5 \times 10^{15}$ cm$^{-3}$ arsenic doping level. Such a varicap is optimized for a frequency of 1.8 GHz, has a tuning range of about 10 using a voltage swing of 0–3 V. The quality factor is at least 14. In an alternative embodiment of these inventive methods, the predetermined varicap doping profile is obtained by implanting $5 \times 10^{13}$ cm$^{-2}$, 400 keV phosphor atoms, $2 \times 10^{12}$ cm$^{-2}$, 200 keV phosphor atoms, and $4 \times 10^{12}$ cm$^{-2}$, 30 keV phosphor atoms in the step of implanting atoms through the first oxide film. Such a varicap is optimized for a frequency of 17 GHz, has a tuning range of about 3 using a voltage swing of 0–3 V. The quality factor is at least 16.

BRIEF DESCRIPTION OF THE DRAWINGS

The present invention will be described with reference to some drawings that are only intended to illustrate, not limit, the scope of protection of the invention. For instance, all doping profiles p/n may be of the reverse type, if required. The scope of protection is only limited by the annexed claims.

In the drawings:

FIGS. 1–5 show in a very schematic way consecutive steps in a process of manufacturing simultaneously an npn transistor, a high density capacitor and a Schottky varicap;

FIG. 6 shows a first embodiment of a varicap doping profile optimized for a frequency of 1.8 GHz, and the location of the depletion region;

FIG. 7 shows the capacitance of the Schottky varicap according to FIG. 6 as a function of the applied voltage;

DETAILED DESCRIPTION OF THE DRAWINGS

Figure 3:
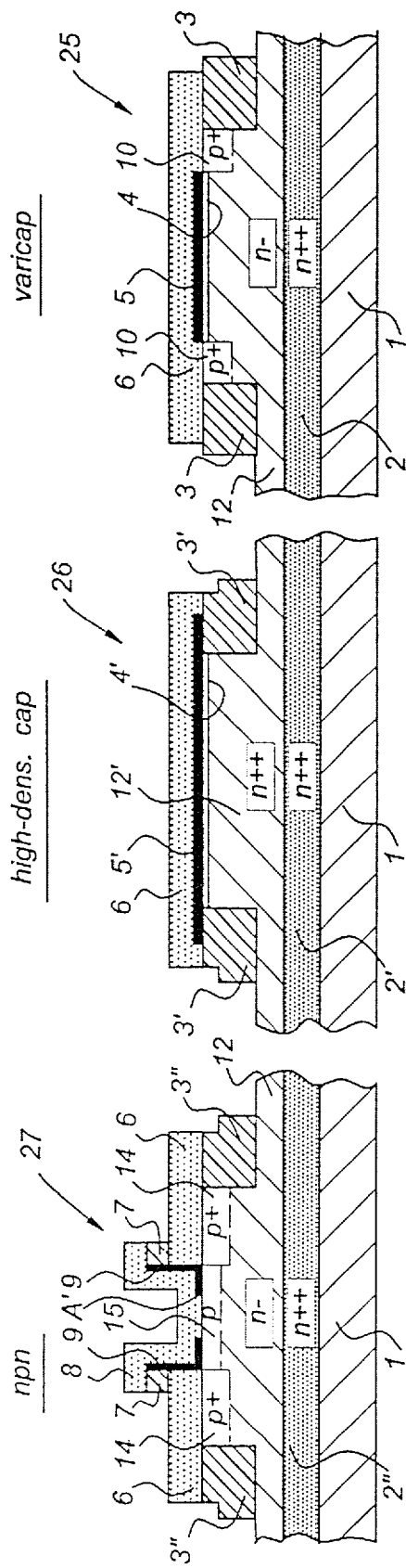

In FIGS. 1 trough 5, three electronic components are shown: from right to left, a varicap 25, a high density capacitor 26 and a npn transistor 27, respectively. FIGS. 1 through 5 show intermediate production steps for making these three components simultaneously. Since they may be present together on a single chip, it is a desirable feature that the varicap 25 according to this invention can be made by using mainly production steps necessary for the other two components. In accordance with the invention, this is done in such a way that only one extra mask is needed. In de following description all three components are considered to be located on one chip. This, however, is not a necessity since the components can be formed simultaneously on different silicon substrates in the same oven as well.

Of course, semiconductor type substrates other than silicon may be used instead and other components may be integrated on the same chip as well.

The structure of the high density capacitor 26 and the transistor 27 are in itself known from the state of the art. The choices of the materials and doping profiles to be used strongly depend on the desired properties of these components, as is known to persons skilled in the art, and therefore will not be dealt with in detail. These components 26, 27 will only be used to show how the production of the varicap 25 can be integrated with the manufacture of high density capacitors and npn transistors since this is an advantageous feature of the current invention.

FIG. 1 shows an initial stage in which some portions of the components 25, 26, 27 have already been formed. Heavily n-doped, buried layers 2, 2', 2" (n++) have been formed in a silicon substrate 1. On top of this substrate 1, an n-type epitaxial layer 12 is grown using a method known from the prior art. At locations where the varicap 25 and transistor 27 are to be formed, this epitaxial layer 12 is doped lightly. Epitaxial layer 12 has a thickness of typically 1 $\mu$m and a doping concentration of $5.10^{15}$ cm$^{-3}$, e.g., using As.

Next, the upper surface of the epitaxial layer 12, 12', 12" is locally oxidized to form oxide layers 3, 3', 3" (LOCOS). Again, this may be done using any method known from the prior art. Where the high density capacitor 26 is to be formed, n-type atoms are implanted to form a heavily doped n++ epitaxial layer 12', e.g., $10^{20}$ cm$^{-3}$.

Next, a rather thin oxide layer, e.g., 20 nm, is grown on the entire structure followed by a nitride layer of, e.g., 50 nm. Both layers are etched such that the structure of FIG. 1 comes into being. I.e., the epitaxial layer 12' of the high density capacitor 26 is entirely covered with a thin oxide film 4' and a nitride film 5' above it. The varicap 25 also has a double film comprising an oxide film 4 and a nitride film 5 on its epitaxial layer surface 12 but a portion of the epitaxial layer surface between this double film 4, 5 and the LOCOS 3 is exposed. Films 4, 5 of the varicap 25 will not be part of the final component, but will be used as a diffusion and etching mask later in the production. Since the formation of both the oxide 4, 4', and nitride layers 5, 5' is necessary for the high density capacitor 26, so far the varicap 25 has been produced without an extra step and no extra mask is required.

In the next step, see FIG. 2, a polysilicon layer 6 of typically 300 nm is grown over al three components 25, 26, 27. This is necessary anyway for both the high density capacitor 26 and transistor 27. For the high density capacitor 26, the polysilicon layer 6 will be necessary to form one of its contacts. For the transistor 27, the polysilicon layer 6 will be needed as a base contact. The polysilicon layer 6 is heavily doped with acceptor particles, preferably p++, for all three components 25, 26, 27. Then an oxide layer 7 is grown on top of the polysilicon layer 6. Using a lithographic process, emitter contact opening A is formed in the polysilicon layer 6 and the oxide layer 7.

The exposed silicon in opening A is oxidized to form a thin, e.g., 20 nm, silicon oxide layer. This oxide layer is formed in a high temperature step of typically 900° C. in $O_2$ during 30 minutes. This high temperature causes diffusion of p-type atoms from polysilicon layer 6 into the epitaxial layer 12 to form base contact 14 in the transistor 27 and guard ring 10 in the varicap 25. Then, self-aligned L-shaped spacers 9 are produced surrounding opening A. These L-shaped spacers 9 comprise the thin oxide $SiO_2$ layer of typically 20 nm referred to above and a thin $Si_3N_4$ layer above it, as is known to persons skilled in the art. Thus, a new opening A' remains which is surrounded by L-shaped spacers 9 and which causes the substrate surface to be exposed.

Then, a second polysilicon layer, n++ doped (typically 200 nm, $10^{21}$ cm$^{-3}$ As), is deposited and emitter contact 8 is formed using a lithographic process. In this same process, oxide layer 7 is etched such that emitter contact 8 is separated from the base contact 6 through a spacer comprising the remainder of oxide layers 7, 9. Now, a situation exists in which, in order to complete the transistor 27, only an emitter RTA diffusion step need be carried out.

Figure 4:
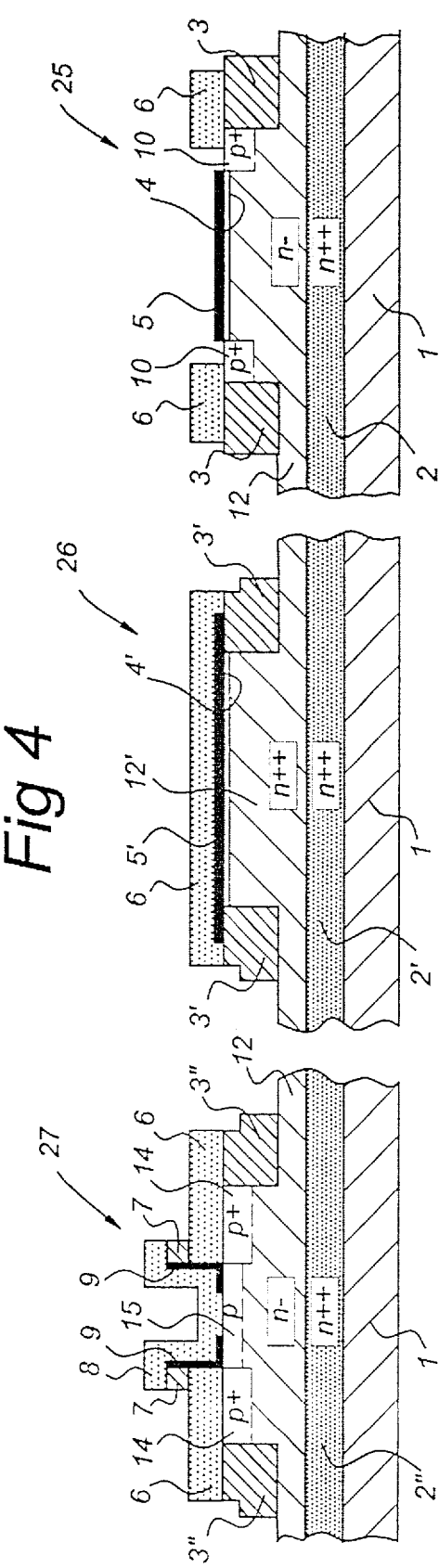

The varicap structure 25 shown in FIG. 4, is obtained by first etching both the oxide layer 7 and the polysilicon layer 6 using an additional photolithographic mask. The nitride film 5 is still intact and operates as a very good etching stop. Due to this nitride film 5, the etching does not affect the epitaxial silicon layer 12 underneath it. Since this is the site where a Schottky junction is going to be formed, this is very desirable. Due to the good surface quality of the silicon, its properties are locally very well known, which helps to form a well-defined junction. This etching step requires the only extra mask needed to form the varicap 25.

Now the nitride film 5 is removed by means of a wet etching step. After the nitride film 5 has been removed, implantations needed for the varicap 25 can be applied. For instance, an n-type doped region 16 can be formed underneath the oxide film 4. This can be done by implanting donor atoms through the oxide film 4 into the, still pure, epitaxial silicon layer 12 underneath it. In an alternative embodiment, the donor atoms are implanted prior to removing the nitride film 5, i.e., through both the nitride film 5 and oxide film 4.

Then, a short emitter RTA diffusion step, typically 10 seconds at 1050° C., is carried out to form emitter 18 of transistor 27. This step also anneals and activates the varicap doping profiles. The thin oxide film 4 is removed using a wet chemical etching step followed by silicidizing all exposed silicon to provide a silicide layer 17 on the entire chip surface, as shown in FIG. 5. The silicide layer 17 is preferably made of PtSi but any other silicide may be chosen instead.

The PtSi 17 and the n-type region 16 will form Schottky varicap structure 25. It is important that the n-type region 16 in the varicap structure has a carrier concentration of less than $10^{17}$ per cubic centimeter on the surface of the epitaxial layer 12. At a higher concentration, hardly any, or no, Schottky junction would be formed between this region and the PtSi layer, resulting in an ohmic contact instead of a Schottky contact.

It is observed that, as a side effect of this invention, the base and emitter polysilicon contacts 6, 8 of the transistor 27 are also covered with PtSi layer 17. This is advantageous because it will reduce parasitic base and emitter series resistances.

The form of the doping profiles of the varicap 25 strongly depends on the design characteristics. FIG. 6 shows a doping profile for the varicap 25, designed to be used for signals with a frequency of around 1.8 Giga Herz, and to have a tuning range of 10 using a voltage swing of 0–3 V, and a quality factor of at least 14. Such design features can be obtained by implanting $4 \times 10^{12}$ cm$^{-2}$, 30 keV phosphor atoms and by having an epitaxial layer background doping level of about $10^{16}$ cm$^{-3}$ (e.g. doped with $5 \times 10^{15}$ cm$^{-3}$ arsenic), as shown in FIG. 6.

Figure 8:
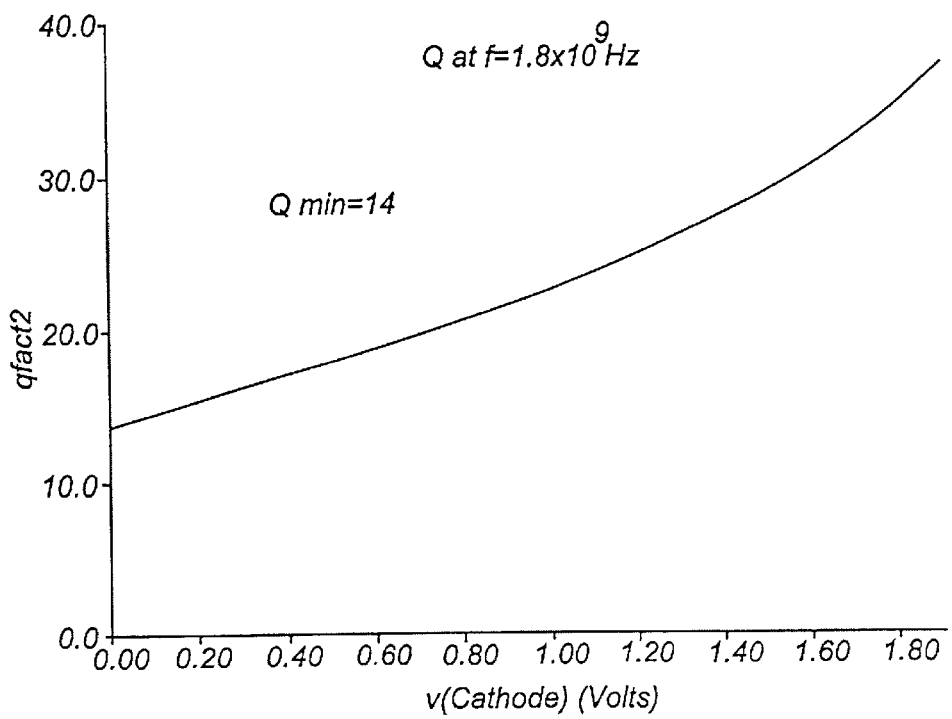
FIG. 8 shows the value of the quality factor of the Schottky varicap according to FIG. 6 as a function of the applied voltage.

FIGS. 7 and 8, show, respectively the capacitance value at $10^{-15}$ Farad/$\mu m^2$ and the quality factor in dependence on the voltage across the varicap 25 with the doping profile of FIG. 6.

Figure 9:
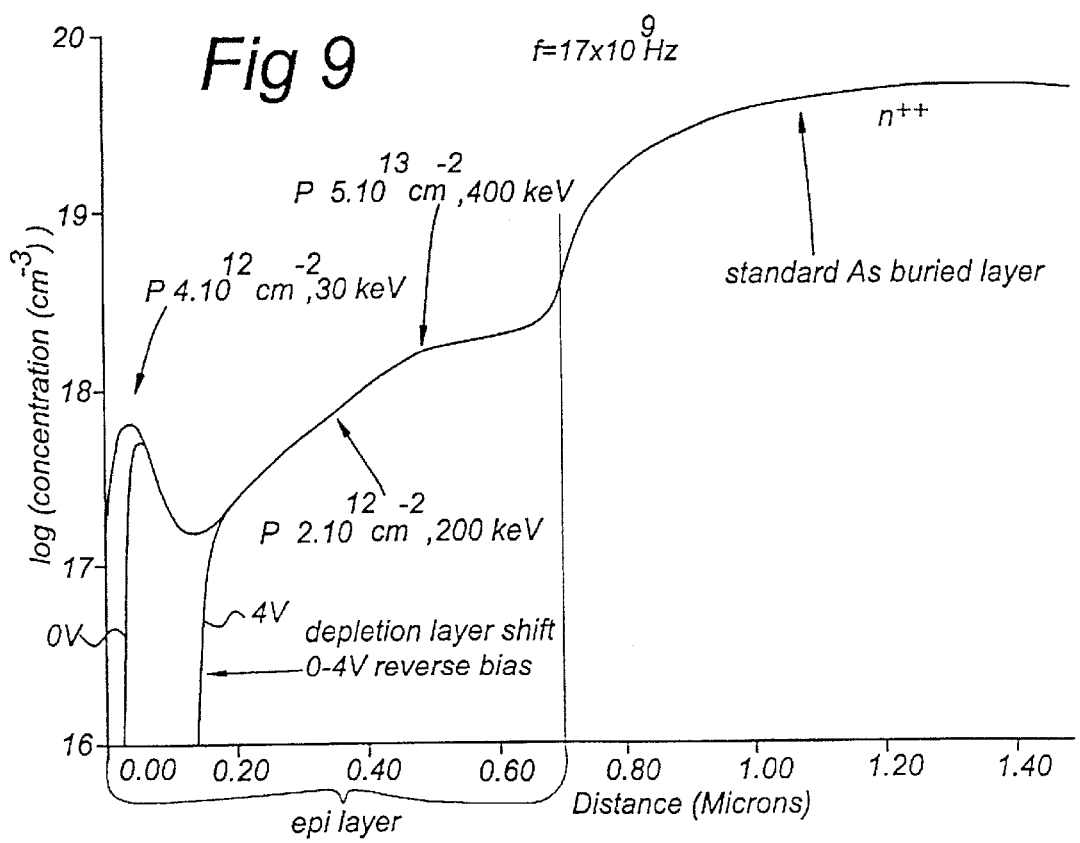
FIG. 9 shows a second embodiment of a varicap doping profile optimized for a frequency of 17 GHz, and the location of the depletion region.

For higher frequencies, it becomes harder to design a varicap with both a large tuning range and a high quality factor. FIG. 9 shows a doping profile for a varicap frequency of 17 GHz. The profile is made with three implantations of phosphor: $4 \times 10^{12}$ cm$^{-2}$, 30 keV which provides a higher concentration n-type layer near the surface, $2 \times 10^{12}$ cm$^{-2}$, 200 keV which provides a deeper located n-type layer, and $5 \times 10^{13}$ cm$^{-2}$, 400 keV which provides a high peak still deeper n-type layer, as shown in FIG. 9.

Figure 10:
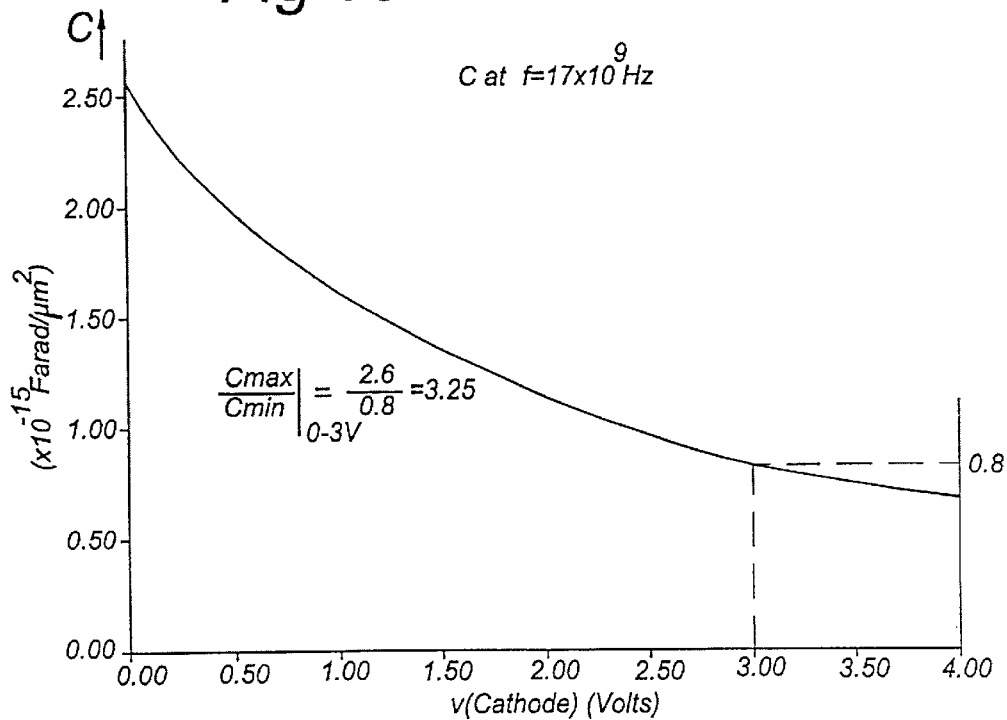
FIG. 10 shows the capacitance of the Schottky varicap according to FIG. 9 as a function of the applied voltage.
Figure 11:
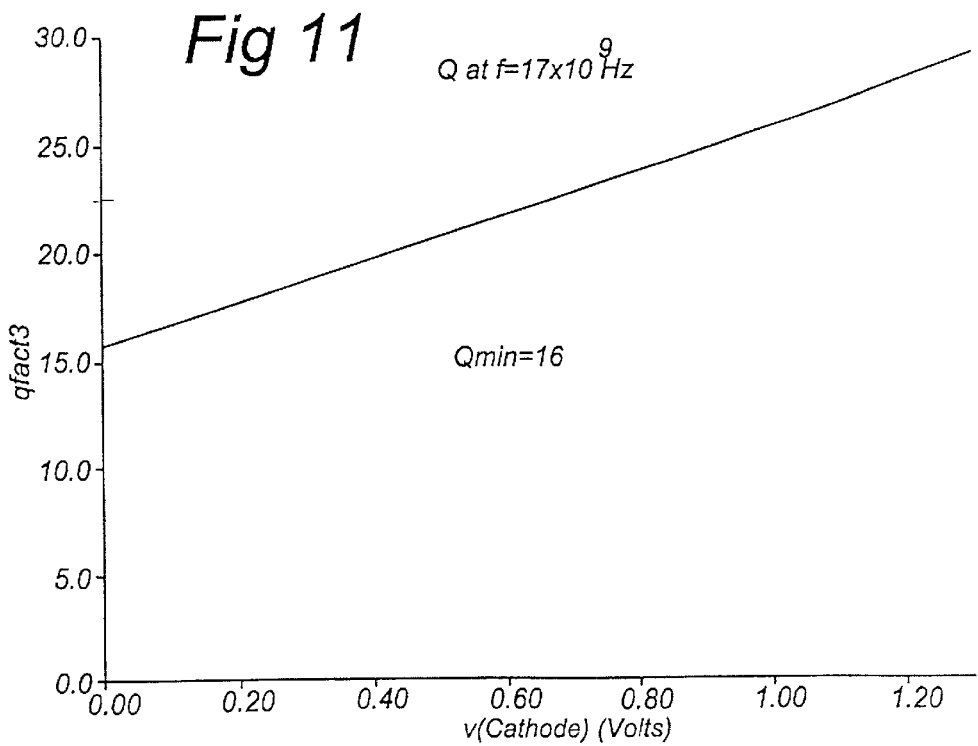
FIG. 11 shows the value of the quality factor of the Schottky varicap according to FIG. 9 as a function of the applied voltage.

The turning range obtained by the profile of FIG. 9 is 3.25 in a range of 0–3 V (FIG. 10), and the quality factor is at least 16 (FIG. 11).

What is claimed is:

1. A method of producing a Schottky varicap (25) using the following steps:
   (a) providing an epitaxial layer (12) on a semiconductor substrate (1), the epitaxial layer (12) having an upper surface and being of a first conductivity type;
   (b) providing an insulating layer, and patterning the insulating layer to provide an insulating film on a predetermined area of said surface of said epitaxial layer (12), said insulating film comprising an oxide film (4) contacting the epitaxial film (12) on said predetermined area and a silicon nitride film (5) above the oxide film (4);
   (c) depositing a polysilicon layer (6) of a second conductivity type;
   (d) applying a first high temperature step to diffuse a guard ring (10) of said second conductivity type into the epitaxial layer (12) around said first predetermined area;
   (e) removing a predetermined portion of said polysilicon layer (6) to expose said first silicon nitride film (5);
   (f) implanting atoms through at least said first oxide film (4) to provide said epitaxial layer with a predetermined varicap doping profile;
   (g) applying a second high temperature step to anneal and activate said varicap doping profile;
   (h) removing said first oxide film (4) to provide an exposed area of said upper surface of said epitaxial layer (12) with the predetermined varicap doping profile;
   (i) providing a Schottky electrode (17) on said exposed area.

2. A method according to claim 1, wherein said Schottky electrode is made of a metal silicide.

3. A method according to claim 2, wherein said metal silicide is PtSi.

4. A method according to claim 1, wherein said predetermined varicap doping profile is obtained by implanting $4 \times 10^{12}$ cm$^{-2}$, 30 keV phosphor atoms in step b, and said epitaxial layer has a $5 \times 10^{15}$ cm$^{-3}$ arsenic doping level.

5. A method according to claim 1, wherein said predetermined varicap doping profile is obtained by implanting $5 \times 10^{13}$ cm$^{-2}$, 400 keV phosphor atoms, $2 \times 10^{12}$ cm$^{-2}$, 200 keV phosphor atoms, and $4 \times 10^{12}$ cm$^{-2}$, 30 keV phosphor atoms in step b.

6. A method of producing a Schottky varicap (25) simultaneously with a transistor (27) on a single chip using the following steps:
   (a) providing an epitaxial layer (12) on a semiconductor substrate (1), the epitaxial layer (12) having an upper surface and being of a first conductivity type;
   (b) providing an insulating film on a first predetermined area of said surface of said epitaxial layer (12), said insulating film comprising a first oxide film (4) contacting the epitaxial layer (12) and a first silicon nitride film (5) above the first oxide film (4);
   (c) depositing a polysilicon layer (6) of a second conductivity type;
   (d) providing an opening (A) in said polysilicon layer (6) at a second predetermined area of said surface of said epitaxial layer (12);
   (e) applying a first high temperature step to diffuse a guard ring (10) of said second conductivity type into the epitaxial layer (12) around said first predetermined area and to diffuse a base contact region (14) adjacent to said second predetermined area;
   (f) providing a base diffusion region (15) of a second conductivity type in said epitaxial layer (12) below said opening (A);
   (g) providing an emitter contact (8) in said opening (A), which emitter contact is electrically insulated from said polysilicon layer (6);
   (h) removing a predetermined portion of said polysilicon layer (6) to expose said first silicon nitride film (5);
   (i) implanting atoms through at least said first oxide film (4) to provide said epitaxial layer with a predetermined varicap doping profile;
   (j) applying a second high temperature step to diffuse an emitter region (18) into said epitaxial layer (12), and to anneal and activate said varicap doping profile;
   (k) removing said first oxide film (4) to provide an exposed area of said upper surface of said epitaxial layer (12) with the predetermined varicap doping profile;

(l) providing a Schottky electrode (17) on said exposed area.

7. A method according to claim 6, wherein said predetermined varicap doping profile is obtained by implanting $4 \times 10^{12}$ cm$^{-2}$, 30 keV phosphor atoms in step j, and said epitaxial layer has a $5 \times 10^{15}$ cm$^{-3}$ arsenic doping level.

8. A method according to claim 6, wherein said predetermined varicap doping profile is obtained by implanting $5 \times 10^{13}$ cm$^{-2}$, 400 keV phosphor atoms, $2 \times 10^{12}$ cm$^{-2}$, 200 keV phosphor atoms, and $4 \times 10^{12}$ cm$^{-2}$, 30 keV phosphor atoms in step j.

9. A method of producing a Schottky varicap (25) simultaneously with a high density capacitor (26) using the following steps:

(a) providing an epitaxial layer (12) on a semiconductor substrate (1), the epitaxial layer (12) having an upper surface and being of a first conductivity type;

(b) implanting atoms in a second predetermined area of said upper surface to provide said epitaxial layer in said second predetermined area with a high doping concentration;

(c) providing an insulating layer, and patterning the insulating layer to provide a first insulating film on a first predetermined area of said surface of said epitaxial layer (12) and a second insulating film on said second predetermined area of said surface of said epitaxial layer (12), said first insulating film comprising a first oxide film (4) contacting the epitaxial film (12) on said first predetermined area and a first silicon nitride film (5) above the first oxide film (4), said second insulating film comprising a second oxide film (4') contacting the epitaxial film (12) on said second predetermined area and a second silicon nitride film (5') above the second oxide film (4');

(d) depositing a polysilicon layer (6) of a second conductivity type;

(e) applying a first high temperature step to diffuse a guard ring (10) of said second conductivity type into the epitaxial layer (12) around said first predetermined area;

(f) removing a predetermined portion of said polysilicon layer (6) to expose said first silicon nitride film (5);

(g) implanting atoms through at least said first oxide film (4) to provide said epitaxial layer with a predetermined varicap doping profile;

(h) applying a second high temperature step to anneal and activate said varicap doping profile;

(i) removing said first oxide film (4) to provide an exposed area of said upper surface of said epitaxial layer (12) with the predetermined varicap doping profile;

(j) providing a Schottky electrode (17) on said exposed area.

10. A method according to claim 9, wherein said predetermined varicap doping profile is obtained by implanting $4 \times 10^{12}$ cm$^{-2}$, 30 keV phosphor atoms in step g, and said epitaxial layer has a $5 \times 10^{15}$ cm$^{-3}$ arsenic doping level.

11. A method according to claim 9, wherein said predetermined varicap doping profile is obtained by implanting $5 \times 10^{13}$ cm$^{-2}$, 400 keV phosphor atoms, $2 \times 10^{12}$ cm$^{-2}$, 200 keV phosphor atoms, and $4 \times 10^{12}$ cm$^{-2}$, 30 keV phosphor atoms in step g.

12. A method of producing a Schottky varicap (25) simultaneously with a transistor (27) and a high density capacitor on a single chip using the following steps:

(a) providing an epitaxial layer (12) on a semiconductor substrate (1), the epitaxial layer (12) having an upper surface and being of a first conductivity type;

(b) implanting atoms in a second predetermined area of said upper surface to provide said epitaxial layer in said second predetermined area with a high doping concentration;

(c) providing an insulating layer, and patterning the insulating layer to provide a first insulating film on a first predetermined area of said surface of said epitaxial layer (12) and a second insulating film on a second predetermined area of said surface of said epitaxial layer (12), said first insulating film comprising a first oxide film (4) contacting the epitaxial film (12) on said first predetermined area and a first silicon nitride film (5) above the first oxide film (4), said second insulating film comprising a second oxide film (4') contacting the epitaxial film (12) on said second predetermined area and a second silicon nitride film (5') above the second oxide film (4');

(d) depositing a polysilicon layer (6) of a second conductivity type;

(e) providing an opening (A) in said polysilicon layer (6) at a third predetermined area of said surface of said epitaxial layer (12);

(f) applying a first high temperature step to diffuse a guard ring (10) of said second conductivity type into the epitaxial layer (12) around said first predetermined area and to diffuse a base contact region (14) adjacent to said third predetermined area;

(g) providing a base diffusion region (15) of a second conductivity type in said epitaxial layer (12) below said opening (A);

(h) providing an emitter contact (8) in said opening (A), which emitter contact is electrically insulated from said polysilicon layer (6);

(i) removing a predetermined portion of said polysilicon layer (6) to expose said first silicon nitride film (5);

(j) implanting atoms through at least said first oxide film (4) to provide said epitaxial layer with a predetermined varicap doping profile;

(k) applying a second high temperature step to diffuse an emitter region (18) into said epitaxial layer (12), and to anneal and activate said varicap doping profile;

(l) removing said first oxide film (4) to provide an exposed area of said upper surface of said epitaxial layer (12) with the predetermined varicap doping profile;

(m) providing a Schottky electrode (17) on said exposed area.

13. A method according to claim 12, wherein said predetermined varicap doping profile is obtained by implanting $4 \times 10^{12}$ cm$^{-2}$, 30 keV phosphor atoms in step j, and said epitaxial layer has a $5 \times 10^{15}$ cm$^{-3}$ arsenic doping level.

14. A method according to claim 12, wherein said predetermined varicap doping profile is obtained by implanting $5 \times 10^{13}$ cm$^{-2}$, 400 keV phosphor atoms, $2 \times 10^{12}$ cm$^{-2}$, 200 keV phosphor atoms, and $4 \times 10^{12}$ cm$^{-2}$, 30 keV phosphor atoms in step j.

* * * * *